US006677218B2

(12) United States Patent
Kirchhoff et al.

(10) Patent No.: US 6,677,218 B2
(45) Date of Patent: Jan. 13, 2004

(54) METHOD FOR FILLING TRENCHES IN INTEGRATED SEMICONDUCTOR CIRCUITS

(75) Inventors: Markus Kirchhoff, Ottendorf-Okrilla (DE); Martin Schrems, Eggersdorf B. Graz (AT)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/210,374

(22) Filed: Jul. 31, 2002

(65) Prior Publication Data

US 2003/0032259 A1 Feb. 13, 2003

(30) Foreign Application Priority Data

Jul. 31, 2001 (DE) .......................... 101 37 431
Sep. 28, 2001 (DE) .......................... 101 47 894

(51) Int. Cl.$^7$ ............................................ H01L 21/762
(52) U.S. Cl. ...................................... 438/441; 438/466
(58) Field of Search .................................. 438/441, 466, 438/444, 425, FOR 231, FOR 330, 429; 257/321.485

(56) References Cited

U.S. PATENT DOCUMENTS

| 3,640,806 | A | * | 2/1972 | Watanabe et al. | ............ 438/441 |
| 3,919,060 | A | * | 11/1975 | Pogge et al. | ................. 438/355 |
| 3,954,523 | A | * | 5/1976 | Magdo et al. | ............... 438/409 |
| 4,016,017 | A | * | 4/1977 | Aboaf et al. | ................ 438/441 |
| 5,135,884 | A | * | 8/1992 | Miller | .......................... 438/441 |
| 5,217,920 | A | | 6/1993 | Mattox et al. | |
| 5,604,144 | A | * | 2/1997 | Kurtz | ........................... 438/53 |
| 5,736,454 | A | | 4/1998 | Hwu et al. | |
| 5,950,094 | A | | 9/1999 | Lin et al. | |
| 6,143,627 | A | * | 11/2000 | Robinson | ...................... 438/441 |
| 6,352,893 | B1 | * | 3/2002 | Michaelis et al. | ........... 438/248 |
| 6,559,069 | B2 | * | 5/2003 | Goldbach et al. | ............ 438/441 |

FOREIGN PATENT DOCUMENTS

| EP | 226091 A2 | * | 6/1987 | ......... H01L/21/306 |
| EP | 506473 A2 | * | 9/1992 | ......... H01L/21/316 |
| JP | 58107645 A | * | 6/1983 | ........... H01L/21/76 |
| JP | 60138937 A | * | 7/1985 | ........... H01L/21/76 |
| JP | 2000-150647 | | 5/2000 | |
| WO | WO 00/75976 A1 | | 12/2000 | |

OTHER PUBLICATIONS

G. Mende et al., "Optimization of Anodic Silicon Oxide Films for Low Temperature Passivation of Silicon Surfaces", *J. Electrochem. Soc.*, vol. 140, No. 1, Jan. 1993, pp. 188–194.
Markus Kirchhoff: "Lokalisierung elektrochemischer Reaktionen an mikro–und nanostrukturiertem Silizium" [localization of electro–chemical reactions on micro–and nano-structure silicon], *Verlag Shaker, Aachen*, 1995, pp. 1–94.

\* cited by examiner

*Primary Examiner*—George Fourson
(74) *Attorney, Agent, or Firm*—Laurence A. Greenberg; Werner H. Stemer; Ralph E. Locher

(57) ABSTRACT

A method in which a recess is formed in the surface of a semiconductor substrate and a material is grown on the inner wall of the recess, includes the steps of producing an electrically insulating layer on the surface of the substrate outside the recess, and selectively growing the material on the inner wall of the recess as a result of the substrate, as an electrode, being brought into contact with an electrolysis liquid and electrolysis being carried out, during which the insulating layer prevents the material from growing outside the recess. Before the electrolysis is carried out, a reserve material is epitaxially deposited on the inner wall of the recess and, during the electrolysis, the reserve material is converted into the material being grown by electrolysis.

27 Claims, 8 Drawing Sheets

Prior Art

METHOD FOR FILLING TRENCHES IN INTEGRATED SEMICONDUCTOR CIRCUITS

BACKGROUND OF THE INVENTION

Field of the Invention

The invention relates to a method for fabricating an integrated semiconductor circuit, in which a recess is formed in a surface of a semiconductor substrate, a material is grown on the inner wall of the recess, an electrically insulating layer is produced on the surface of the semiconductor substrate outside the recess, and the material is grown selectively on the inner wall of the recess as a result of the semiconductor substrate, as an electrode, being brought into contact with an electrolysis liquid and electrolysis being carried out, during which the insulating layer prevents the material from growing outside the recess.

During the production of integrated semiconductor circuits, recesses, in particular, trenches, are formed and are then filled with a different material than the semiconductor substrate, generally, silicon. Often, relatively complex structures are also produced within a trench. In some cases, it is necessary for the inner wall of the trench to be covered with a thin film without the trench being completely filled. In these applications, the trenches are very deep in relation to their cross-section; they have a high aspect ratio, i.e., a high ratio of the trench depth to the trench cross-section. In the case of shallow trench isolations, the ratio may be between 2 and 8, while in the case of deep trench isolations this ratio may be up to 60.

To fill deep trenches or to cover their inner wall, the material that is to be introduced or the constituent that has to be introduced to form the material has to be guided onto the inner wall such that the trench opening is not closed up before the trench has been filled or its inner wall has been lined.

Keeping the trench opening clear during the deposition represents a considerable technical problem, in particular, in the case of deep trenches. It is often not possible to achieve complete, void-free filling of the trenches because growth closes up the trench in its upper region before it has been completely filled from below. In such a case, cavities, referred to as voids, remain in the interior of the trench.

The method that is most frequently used for partial or complete filling of a trench is chemical vapor deposition (CVD). In the CVD method, chemical compounds, such as for example, oxides or nitrides, are deposited from a vapor phase, which generally contains organometallic substances. Therefore, the deposition takes place over the entire surface of the semiconductor substrate, i.e., both within and also laterally outside or above the recesses. The deposition takes place to a thickness that corresponds to at least half the trench diameter, and, consequently, the growth closes up the trench from the sides. In the case of anisotropic deposition in a direction that is perpendicular to the substrate surface, the trench can also be filled from the bottom. During the filling of a trench with the aid of deposition, a layer that extends over the entire surface of the semiconductor substrate is deposited, the layer having to be removed again above the trench opening. Such removal requires planarization processes, such as chemical mechanical polishing (CMP). These processes entail additional outlay and, on account of topography structures of the semiconductor substrate, do not always result in complete and uniform removal of the deposited material. In some cases, oxidation processes are used to form oxide layers on regions of the surface of a semiconductor substrate. A metal that is exposed on an inner wall of a trench can also be oxidized in this way. The oxidation is carried out at high temperatures in an oxygen-containing environment. However, during the filling of trenches by oxidation processes the oxide layer also grows on the substrate surface; furthermore, the temperature of, for example, 600° C. required for the oxidation, which would have to be maintained throughout the entire duration of the conditioning step, can cause damage to semiconductor structures.

For the material that is intended to fill the trenches to be deposited only in the trenches but not on the remainder of the substrate surface, prior art methods provide for an electrically insulating layer to be produced on the surface of the semiconductor substrate outside the recess and for the material to be grown selectively on the inner wall of the recess as a result of the semiconductor substrate, as electrode, being brought into contact with an electrolysis liquid and electrolysis being carried out, during which the insulating layer prevents the material from growing outside the recess. The material that is grown by electrolysis only on the inner wall of the recess obviates the need for subsequent removal of the outer substrate surface because the electrically insulating layer that has been applied to this surface prevents electrolytic growth.

Although electrolytic conversion only at the inner wall of trenches leads to selective growth only in the interior of recesses, which are not covered with the insulating layer, in such a method, the semiconductor substrate is attacked. As a result, the original trench dimensions are changed.

However, this method has the drawback that the electrolysis changes the original trench dimensions; during the electrolytic oxidation, the oxide that is formed (silicon oxide in the case of a silicon substrate) grows not only into the trench opening but also into the surrounding substrate material because silicon is consumed during the oxidation process.

SUMMARY OF THE INVENTION

It is accordingly an object of the invention to provide a method for filling trenches in integrated semiconductor circuits that overcomes the hereinafore-mentioned disadvantages of the heretofore-known devices and methods of this general type and that allows a material to be grown only on the inner wall of recesses in a semiconductor substrate, i.e., avoiding growth outside the recesses, while maintaining the lateral dimensions of the recesses.

With the foregoing and other objects in view, there is provided, in accordance with the invention, a method for fabricating an integrated semiconductor circuit, including the steps of forming at least one recess in a surface of a semiconductor substrate, epitaxially depositing a reserve material on an inner wall of the recess, producing an electrically insulating layer on the surface of the substrate outside the recess, and bringing the substrate as an electrode into contact with an electrolysis liquid and carrying out electrolysis to selectively grow the material on the inner wall of the recess while the insulating layer prevents the material from growing outside the recess and to convert the reserve material into the material being grown by the electrolysis.

According to the invention, in the method, before the electrolysis is carried out, a reserve material is epitaxially deposited on the inner wall of the recess, and during the electrolysis the reserve material is converted into the material that is being grown by electrolysis.

According to the invention, electrolytically produced growth is linked to a deposition process. Although the use of a deposition process is not recommended, in particular, if the substrate is covered with an insulating layer that inhibits electrolytic growth outside the recesses, because the electrically insulating covering layer is able to prevent electrolytic growth outside the recesses but cannot prevent growth during a deposition process, according to the invention epitaxial and, therefore, selective growth, which takes place only on the inner wall of the recesses, is used, with the result that at the inner wall of the recesses a reserve material is formed on the semiconductor material and is subsequently converted by electrolysis.

According to the invention, therefore, the steps of "deposition" and "electrolysis", which have hitherto been alternatives to one another, are combined with one another.

Before the electrolysis is carried out, a reserve material is epitaxially deposited on the inner wall of the recess, and, during the electrolysis, the reserve material is converted into the material that is being grown by electrolysis. During an electrolytic reaction, in which the semiconductor substrate is used as electrode, the semiconductor material is electrochemically converted. As a result, geometries of preshaped microelectronic structures are changed. In particular, in the case of a silicon substrate that is electrochemically oxidized, the oxide layer on the inner wall of a trench grows not only inward but also outward and, in doing so, consumes silicon from the substrate. As a result, the effective diameter of the trench is increased in the regions in which the oxide is subsequently removed again. To compensate for such a geometry change, a reserve material is deposited and is consumed during the electrolytic conversion so that the substrate material itself does not need to be converted. Preshaped geometries are, therefore, retained. During the epitaxial deposition, which proceeds significantly more slowly than CVD, the growth rate is identical at any depth in a trench so that the layer thickness of the reserve material deposited is unchanged over the depth of a trench. Furthermore, the epitaxial growth takes place only on single-crystal surfaces (with the crystal structure being continued in the reserve material deposited). Therefore, such growth is likewise selective.

The deposition process can be carried out after the electrically insulating covering layer has been formed, the covering layer not being covered on account of the fact that the growth is selective because it is epitaxial. The epitaxial deposition may be carried out prior to the application of the insulating covering layer, provided that, before the epitaxial deposition, a covering layer that is of a different material is applied to the substrate outside the recesses, only the inner wall of the recesses being covered by the reserve material selectively with respect to the different material.

During the electrolysis, the surface of the semiconductor substrate, including the trenches, is brought into contact with an electrolysis liquid, and the semiconductor substrate is connected as one of at least two electrodes to a voltage source that effects the electrolytic process. Conventional electrolysis techniques and devices can be used for such a purpose.

Before the electrolysis is carried out, the surface of the semiconductor substrate outside the recesses, i.e., laterally between the recesses, is provided with an electrically insulating layer so that the semiconductor substrate on its front surface is only electrically conductive within its trenches. For such a purpose, the insulating layer is preferably produced even before the recesses have been formed in the semiconductor substrate. If the semiconductor substrate is now connected to a suitable redox potential, for example, from its rear surface, the electrolytic operation takes place only within the trenches, i.e., precisely in the regions of the substrate surface that are most difficult to gain access to during a deposition process. The electrically insulating layer outside the trenches prevents growth of the material so that the material is only formed on the inner wall of the trenches.

In accordance with another mode of the invention, galvanostatic electrolysis is carried out, in which the electrolysis voltage rises over the duration of the electrolysis until it reaches a maximum value. Such a process makes use of the fact that, while some of the material has grown and the layer thickness of the grown layer is increasing continuously, the electrolysis voltage required for further growth of the layer increases with the thickness of the existing layer. The required minimum level of the electrolysis voltage is lowest at the start of the electrolysis, when, as yet, no material has been grown by electrolysis, and increases continuously as the layer thickness increases. Because the electrolysis voltage that is actually used acquires a level that corresponds to such a profile and is dependent on the instantaneous layer thickness, particularly uniform growth of the layer is achieved in each region of the trench or the other recess.

In accordance with a further mode of the invention, the maximum value of the electrolysis voltage is maintained until a thickness of the grown material that corresponds to this maximum value has been reached everywhere in the recess. Normally, the electrolytically grown layer has the same thickness everywhere, because a locally reduced layer thickness causes a lower resistance through the layer at that location and the greater electrolysis voltage at that location automatically brings about increased growth, so that the layer thickness is matched again. Therefore, the electrolytically grown layer has a uniform layer thickness.

However, it is conceivable, in very deep trenches, that the material that is to be supplied by the electrolysis liquid may be depleted at the bottom of a trench at a greater rate than can be topped up by diffusion from the opening of the trench. Such a low concentration of the electrolysis liquid can contribute to local depletion in the lower region of a deep trench. Therefore, the maximum value of the electrolysis voltage is maintained until the depletion has been compensated for again by sufficient diffusion of the electrolysis liquid and the minimum layer thickness corresponding to the electrolysis voltage has been achieved everywhere, including at the base of the trench.

In accordance with an added mode of the invention, the electrolysis is continued until the growth has closed up the recess and the electrolytically grown material completely fills the recess below the electrically insulating layer.

In such a case, growth closes up the recess from the side. Preferably shallow trench isolations are so fabricated. The increasing aspect ratio of these isolations, which, in the future, will reach values of between 4 and 8, requires particularly uniform growth to avoid voids. Deep trench isolations, which are already filled over most of their depth and are to be filled with a further material approximately in an upper region, also require uniform growth.

During the filling of these trenches, the side walls of which are not precisely parallel to one another in cross-section, but, rather, increasingly converge, with an inclination of a few degrees, at an increasing depth in the substrate, the surface of the electrolytically grown layer has the same angle of inclination as the trench inner wall and closes up the trench from the bottom upward. The inventive use of electrolysis to fill trenches in this case automatically results in void-free filling.

With regard to the handling of the semiconductor substrate during the electrolysis, in accordance with an additional mode of the invention, the semiconductor substrate is brought into contact with the electrolysis liquid as a result of it being held, with its upper side facing downward, at the height of the level of the electrolysis liquid. In such a position, it "floats" on the liquid, although a holder is gripping the substrate at the edge and holding it in place. An advantage of this embodiment is that the semiconductor substrate can be guided onto the liquid from above without it being necessary for the rear surface to be immersed in the liquid and, thereby, wetted. Moreover, the liquid can be stationary when a plurality of substrates are being successively brought into contact therewith.

Alternatively, it is possible to provide for the semiconductor substrate to be brought into contact with the electrolysis liquid as a result of a vessel with an open base and an adjoining seal being fitted onto the upwardly facing surface of the semiconductor substrate and being filled with the electrolysis liquid. In such a case, the contact surface between the seal and the semiconductor substrate is sealed by the weight of the vessel itself.

In both embodiments, the semiconductor substrate is connected to the voltage source for the electrolysis from the side that is, in each case, not wetted.

In accordance with yet another mode of the invention, the reserve material is epitaxially deposited selectively on substrate material at the inner wall of the recess. Because the substrate material already has a single-crystal structure, it can be selectively covered with the reserve material if the substrate surface outside the recesses is covered by a different material, for example, a nitride or a material that is not in single-crystal form.

In accordance with yet a further mode of the invention, the electrolysis is continued until the reserve material has been completely consumed and a quantity of substrate material that is at least half as great as the quantity of reserve material consumed has been converted. If slight widening of trenches as a result of the electrolytic conversion cannot be accepted, it is advantageous for the electrolysis to be continued until the reserve material has definitely been completely consumed, so as not to produce any additional boundary layers between the deposited reserve material and the substrate material.

As reserve material, in accordance with yet an added mode of the invention, it is preferable to deposit silicon that is oxidized during the electrolysis so that silicon oxide is formed. During such a process, approximately half the silicon oxide grows into the trench interior and approximately half grows into the reserve material or into the substrate material.

In accordance with yet an additional mode of the invention, as the recess, a trench, by which adjacent components on the surface of the semiconductor substrate are isolated from one another, is filled with the electrolytically grown material over its entire cross-section. Such trenches, which are used to isolate microelectronic components, such as, for example, transistors, from one another are referred to as shallow trench isolations. They have aspect ratios of between 2 and 4, and, in the future, between 3 and 8, and generally include an oxide-containing trench filling.

In accordance with again another mode of the invention, the electrolytic growth is continued until the trench has been completely filled from its side walls, i.e., growth has closed the trench from the outside inwards. Such growth eliminates the customary need for a layer to be deposited to a layer thickness of half the trench diameter and for such a layer then to be removed again by chemical mechanical methods and/or devices. The shallow trench isolation grows up to the height at which the electrically insulating layer preventing growth on the surface begins and as far as the center of the trench.

A refinement of such an embodiment provides that the trench is then covered by deposition up to the upper side of the electrically insulating layer. In such a case, a covering layer is deposited above the trench, which has been filled with the electrolytically grown material, by a standard deposition process. The covering layer—preferably including an oxide—is significantly thinner than required by the cross-section of the trench because the trench has already been filled up to the center and merely has to be covered up to the height of the surface of the insulation layer. The relatively thin oxide layer that is applied to the entire surface of the semiconductor substrate is easy to remove again.

In accordance with again a further mode of the invention, the inner wall of a trench, which leads vertically into the semiconductor substrate, for a storage capacitor is covered with the electrolytically grown material, and that the electrolytically grown material in the trench for the storage capacitor is used to produce a collar region.

If a deep trench capacitor is being produced, what is referred to as a collar region has to be formed in the upper region of the trench in order to provide insulation with respect to components that are located in the vicinity of the surface of the semiconductor substrate. The collar region includes a relatively thick oxide layer at the upper trench wall and is usually introduced after the trench has been filled with a filling material, which limits the depth of the collar region, up to the height to which the collar region is to extend. With the aid of the electrolytic growth that is used according to the invention, the collar region can be covered over the entire trench depth that is still to be filled by a collar layer of uniform thickness.

In accordance with again an added mode of the invention, before the electrolysis is carried out, the reserve material is deposited in the trench, that a filling that only covers the reserve material in a lower subregion of the trench is fabricated, and that the reserve material above the filling is converted as a result of the electrolysis. During the formation of a collar region, oxide coverage of the trench wall is required only in an upper subregion of the trench. First of all, the reserve material is deposited on the entire trench wall. Then, a filling material, which completely fills the trench, i.e., completely covers the layer of reserve material, is deposited. By etching back the filling to a depth that corresponds to only part of the trench depth, the reserve material is uncovered again in an upper subregion of the trench so that the reserve material in this region can be electrolytically converted.

In accordance with again an additional mode of the invention, before the electrolysis is carried out, a covering layer, which covers the inner wall of the trench only in a lower subregion of the trench, is produced in the trench, and that the reserve material is only deposited in the uncovered part of the trench. In such a case, in terms of its function of preventing electrolytic conversion, the covering layer corresponds to the filling of the refinement described above. However, the covering layer is deposited before the reserve material rather than after it. The covering layer covers the substrate material of the inner wall of the trench. The covering layer is initially deposited in the entire trench. Then, a filling that completely fills the trench is deposited.

This filling is etched back down to a depth that corresponds to only part of the trench depth. The covering layer that has been partially uncovered again in this way is removed again in an upper trench region above the filling so that the reserve material can be epitaxially grown in this region.

In accordance with still another mode of the invention, it is preferable to deposit a covering layer including a nitride, in particular, including silicon nitride. In addition to the above-described shallow trench isolations and trenches for storage capacitors, any other applications in which recesses in a substrate surface are filled or at least covered by an electrolytic operation used in accordance with the invention are conceivable.

In accordance with still a further mode of the invention, to produce the electrically insulating layer on the surface of the semiconductor substrate outside the recess, it is preferable to use a nitride, in particular, silicon nitride. Such material is also suitable as pad nitride that, during the removal of oxide that has additionally been deposited from a vapor phase, indicates the end of the planarizing operation.

In accordance with still an added mode of the invention, it is preferable for an oxide, preferably, a silicon oxide, to be grown by electrolysis. The choice of silicon oxide, in particular, has the advantage that the material can be formed through conversion of the silicon of the semiconductor substrate. The oxygen required is provided in the form of a suitable molecule or ion from the electrolysis liquid.

In accordance with still an additional mode of the invention, the electrolytically grown material is compacted by conditioning. In the case of silicon oxide as the electrolytically grown material, such a conditioning step is carried out at temperatures of between 300 and 700° C., preferably, at approximately 600° C. However, the conditioning is only of short duration and is preferably used when only thin layers are deposited at the inner wall of recesses.

With the objects of the invention in view, there is also provided a method for fabricating an integrated semiconductor circuit, including the steps of forming at least one recess in a surface of a semiconductor substrate and growing a material on an inner wall of the recess by producing an electrically insulating layer on the surface of the substrate outside the recess, bringing the substrate as an electrode into contact with an electrolysis liquid and carrying out electrolysis to selectively grow the material on the inner wall of the recess with the insulating layer preventing the material from growing outside the recess, before carrying out the electrolysis, epitaxially depositing a reserve material on the inner wall of the recess, and, during the electrolysis, converting the reserve material into the material being grown by the electrolysis.

With the objects of the invention in view, there is also provided a method for homogeneously filling at least one recess in a surface of a semiconductor substrate, the recess having an inner wall, including the steps of epitaxially depositing a reserve material on the inner wall of the recess, producing an electrically insulating layer on the surface of the substrate outside the recess, and bringing the substrate as an electrode into contact with an electrolysis liquid and carrying out electrolysis to selectively grow the material on the inner wall of the recess while the insulating layer prevents the material from growing outside the recess and to convert the reserve material into the material being grown by the electrolysis.

Other features that are considered as characteristic for the invention are set forth in the appended claims.

Although the invention is illustrated and described herein as embodied in a method for filling trenches in integrated semiconductor circuits, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

DESCRIPTION OF THE PREFERRED EMBODIMENTS

Referring now to the figures of the drawings in detail and first, particularly to FIG. 1 thereof, there is shown a semiconductor substrate 2, on the surface 1 of which an electrically insulating layer 6, for example, a pad nitride 6, has been deposited. The layer 6 is used as hard mask for the patterning of recesses, in particular, trenches, and may furthermore, if necessary, be used as a stop layer during a planarization operation.

Figure 1A:
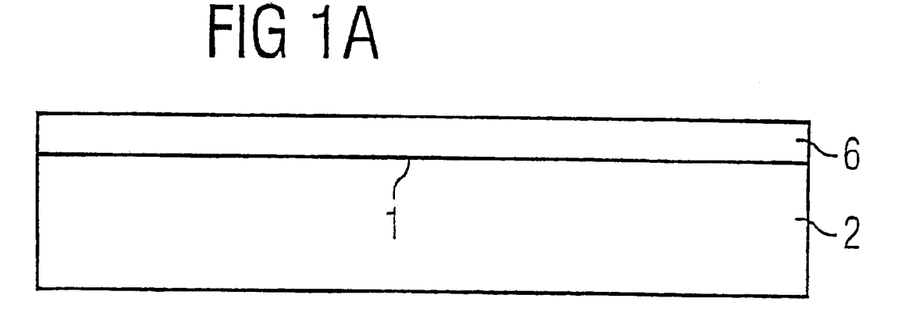
FIGS. 1A to 1D and 1F to 1H and 1J to 1P are fragmentary, diagrammatic, cross-sectional views of a fabrication of a collar region according to the invention.
Figure 1B:
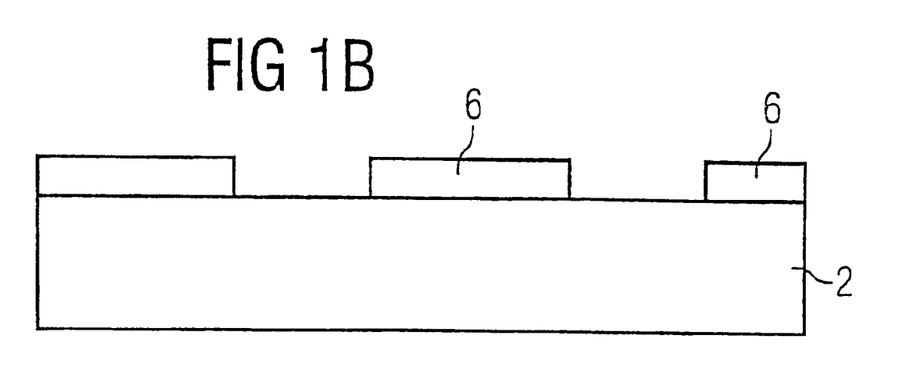

In FIG. 1B, the insulating layer 6 has been patterned with the aid of a mask. As a result, openings in the insulating layer 6 are formed at the location of trenches that are to be etched into the semiconductor substrate 2. Trenches 3 that extend into the interior of the semiconductor substrate 2 are formed by an anisotropic etching process and are shown (not to scale) in FIG. 1C. The aspect ratio between trench depth and trench width is between 2 and 8 in the case of a shallow trench isolation, but may be up to 50 or even 60 in the case of deep trench structures for capacitors that are to be disposed very deep in the semiconductor substrate 2.

Figure 1C:
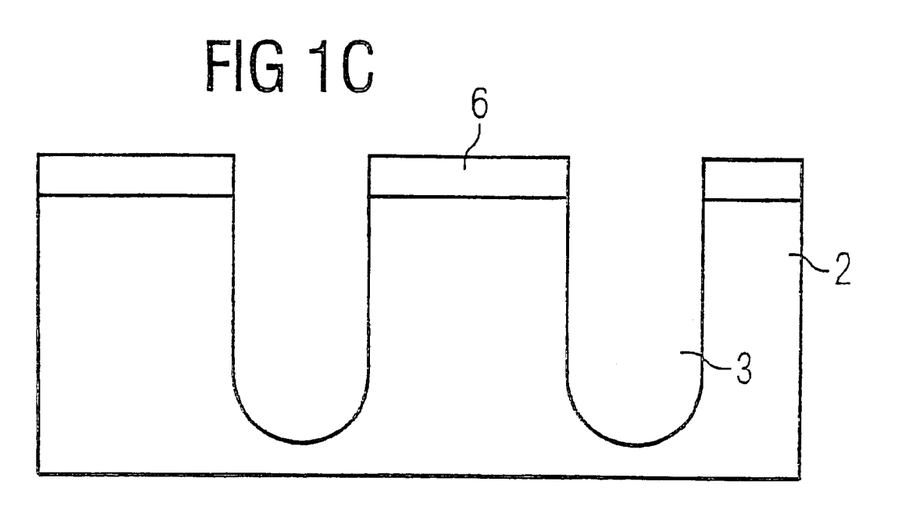
Figure 1D:
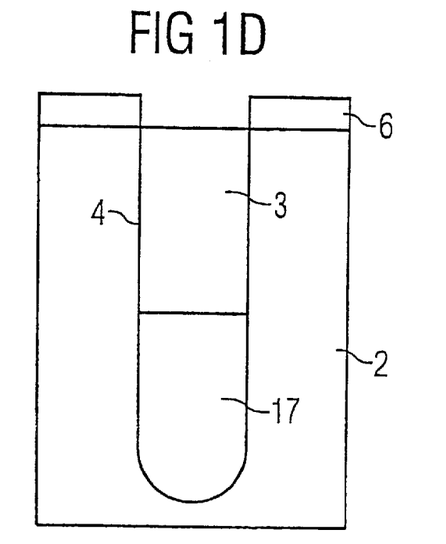

In the case of a deep trench capacitor, as illustrated in FIG. 1D, the trench 3 is filled with a filling material 17 up to the depth at which the capacitor is to be formed. Above the filling 17, what is referred to as a collar region, in the form of a cylindrically running covering layer, has to be fabricated on the trench inner wall 4 above the filling 17 in order to insulate the trench capacitor that is formed from components at the substrate surface 1.

Figure 1E:
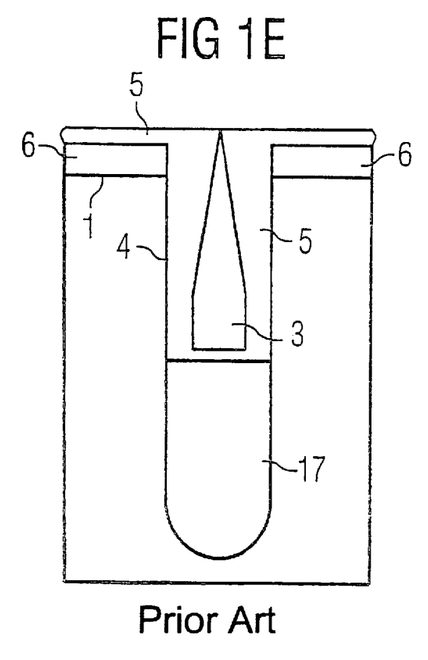
FIG. 1E is a fragmentary, diagrammatic, cross-sectional view of a fabrication of a collar region according to the prior art.
Figure 1F:
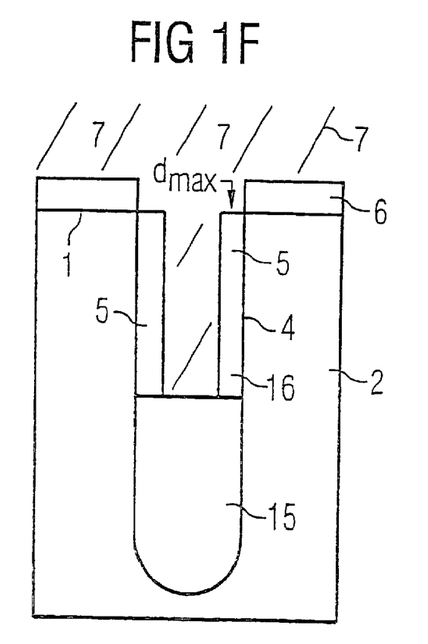

The formation of such a collar region by a conventional deposition process is illustrated in FIG. 1E, while the formation of the collar region by the method according to the invention is illustrated in FIG. 1F.

If the material for the collar region is deposited above the trench 3 using a conventional deposition process, the collar material 5 deposited has approximately the form illustrated in FIG. 1E. Although the inner wall 4 of the trench 3 above the filling 17 is covered with the deposited material 5, the material does not form a layer of homogeneous thickness. Rather, it prematurely closes up the trench 3 in the vicinity of its trench opening at the height of the insulating layer 6. Moreover, on account of the deposition process, the material 5 that is intended to form the collar region is also deposited above the pad nitride layer 6 and has to be removed again at that location. Finally, the material 5 also covers the trench base above the lower filling 17, where it likewise has to be etched away again in order for the filling 17 to be removed.

According to the invention, the collar region 5 is produced as a result of the semiconductor substrate 2, as an electrode, being brought into contact with an electrolysis liquid and electrolysis being carried out. As a result, electrochemical conversion processes can take place at locations where the surface of the semiconductor substrate 1 is electrically conductive or is covered with an only very thin nonconductive layer. If the semiconductor substrate that is connected to the voltage source for the electrolysis and is suitably electrically biased is brought into contact with the electrolysis liquid 7, as illustrated in FIG. 1F, the electrically insulating layer 6 prevents an electrolytic reaction on the substrate surface 1 outside the trench 3. However, at the inner wall 4 of the trench 3, where the electrically conductive, biased substrate material comes into contact with the electrolysis liquid 7, a layer is grown as a result of the electrolytic conversion of the semiconductor material. In such a case, by way of example, silicon is converted into silicon dioxide and forms the collar oxide 16. The trench filling 17, itself, is electrically insulating and is, therefore, not covered by the grown material 5.

On account of the use of electrolysis to fabricate the collar region 16, and as a result of the substrate upper side 1 being protected by the insulating layer 6, the collar material 5 is only formed at the intended location, i.e., on the inner wall 4 in the interior of the trench 3. Moreover, the thickness of the electrolytically produced layer 5 is constant over the entire height of the covered trench wall 4. Consequently, the opening of the trench 3 cannot close up. The electrolysis used according to the invention is, therefore, suitable for fabricating a coverage of uniform thickness on a trench inner wall 4.

With the aid of the method according to the invention, it is also possible to completely fill a trench all the way to the center. The uniform layer growth that results from the electrolysis allows trenches to be filled without leaving voids, whereas with conventional deposition processes they become closed off in the region of their trench opening before they have been completely filled.

Figure 1G:
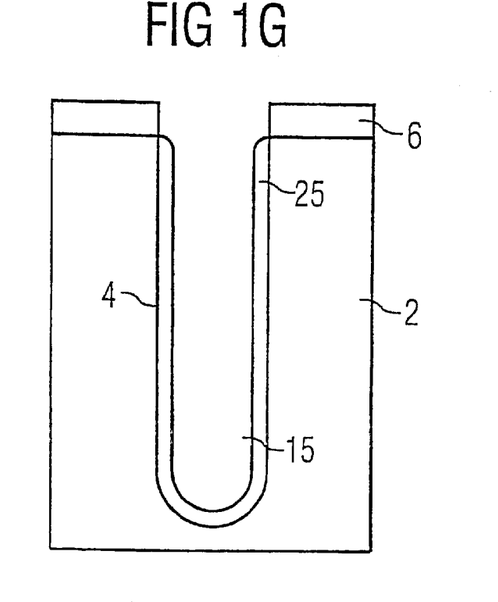

According to a refinement of the invention, a reserve material 25, for example, silicon 25, is deposited epitaxially prior to the electrolysis, as illustrated in FIG. 1G. Epitaxial deposition can only take place on single-crystal surfaces, i.e., only in the interior of the trench opening 15 on the inner wall formed by the substrate material 2. Therefore, the reserve material 25 is only formed where it is intended for electrolytic conversion to take place. The low growth rate of the epitaxial deposition results in conformal deposition with a three-dimensionally homogeneous layer thickness.

The epitaxially deposited reserve material is only required in the upper region of the trench 15, where the collar region is to be formed. To limit the electrolytic formation of silicon oxide from the silicon 25 to this region, a layer that completely fills the trench 15 and also covers the semiconductor substrate is deposited on the semiconductor substrate 2 with the epitaxially deposited silicon 25. The layer is then partially etched back, resulting in the structure obtained in FIG. 1H. In this structure, a lower subregion 22 of the trench 15 is covered with a remainder of the layer, with the filling 21. The filling 21 covers the silicon 25 in the lower trench region 22. In the upper trench region 24, by contrast, the reserve material 25 is uncovered and can be converted into silicon oxide 5 in an electrolysis liquid 7, as illustrated in FIG. 1J. The electrolytically grown silicon oxide 5 narrows the diameter of the uncovered trench opening but simultaneously also grows into the layer of the reserve material 25 or—given a prolonged electrolysis duration—into the substrate material 2. In FIG. 1J, the duration of the electrolysis was selected to be just such that the trench-side boundary of the substrate material 2 at the inner wall of the trench 15 is not changed by the successive method steps of epitaxial deposition and electrolytic conversion.

Figure 1H:
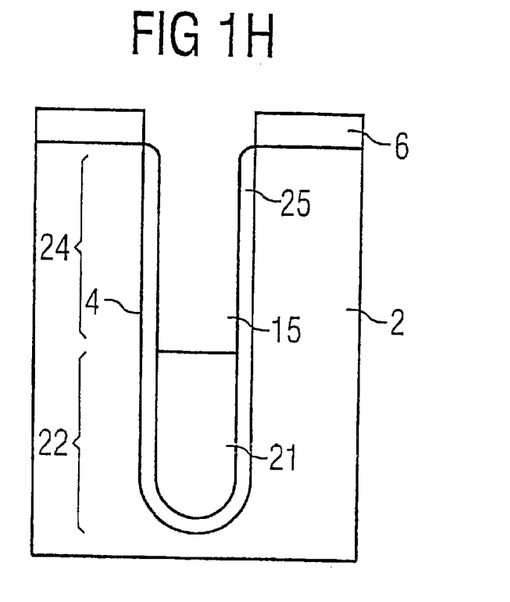
Figure 1J:
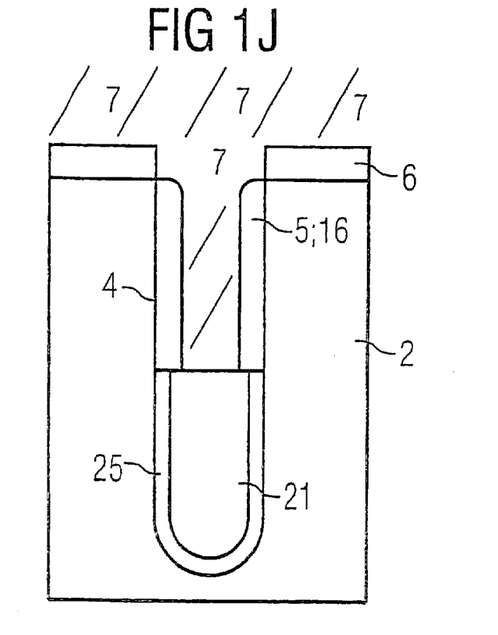
Figure 1K:
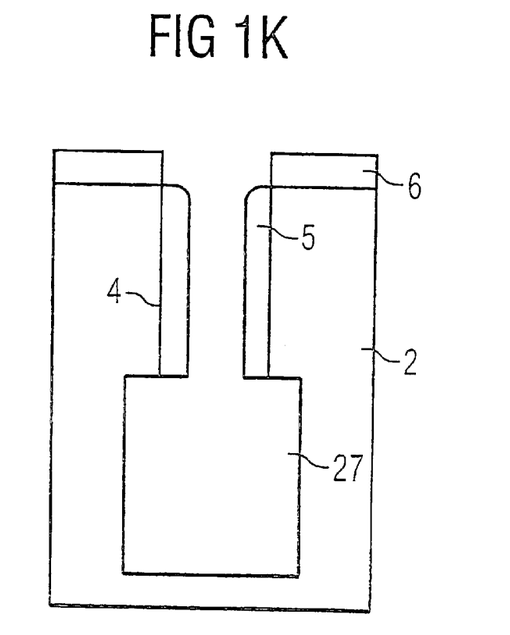

The trench 15 that has been provided with the collar region 16 can be widened in the lower region in a similar manner to a bottle by etching to allow a capacitor of even greater capacitance to be produced in a larger cavity 27, which is illustrated, not to scale, in FIG. 1K, As an alternative to the method steps illustrated in FIGS. 1G, 1H, and 1J, the collar region may also be produced using the procedure illustrated in FIGS. 1L to 1P.

Figure 1L:
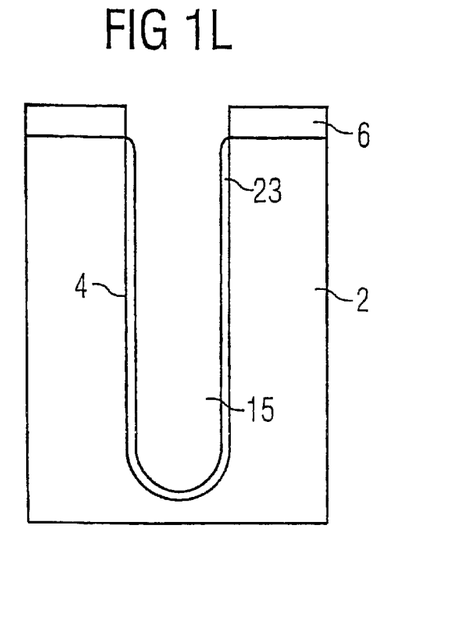
Figure 1M:
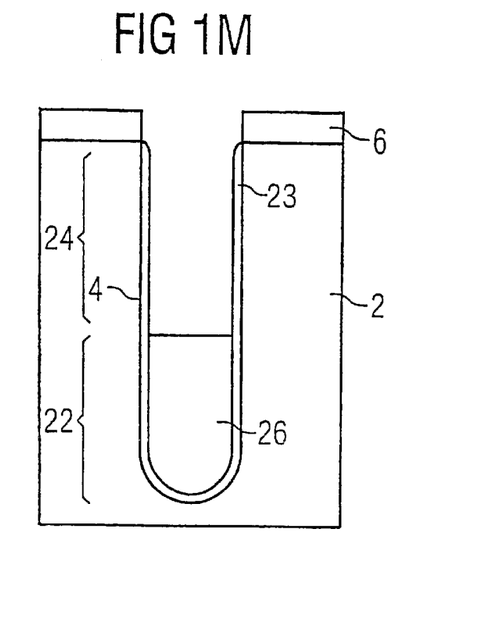
Figure 1N:
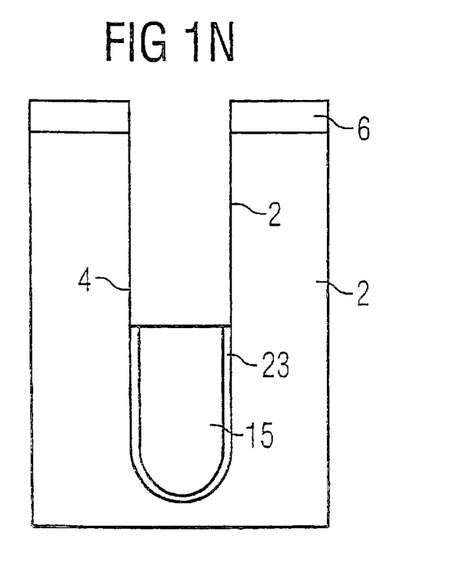
Figure 1O:
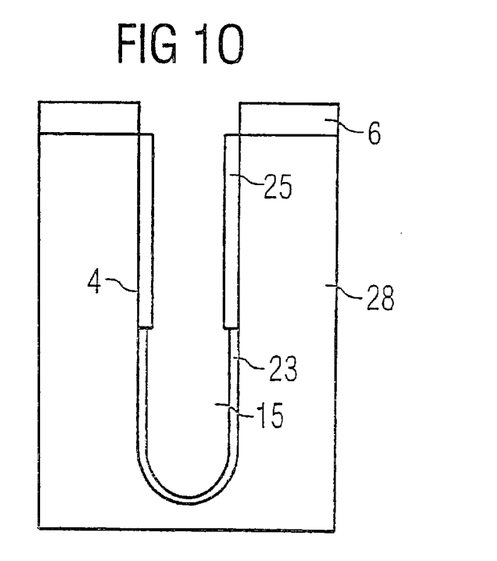
Figure 1P:
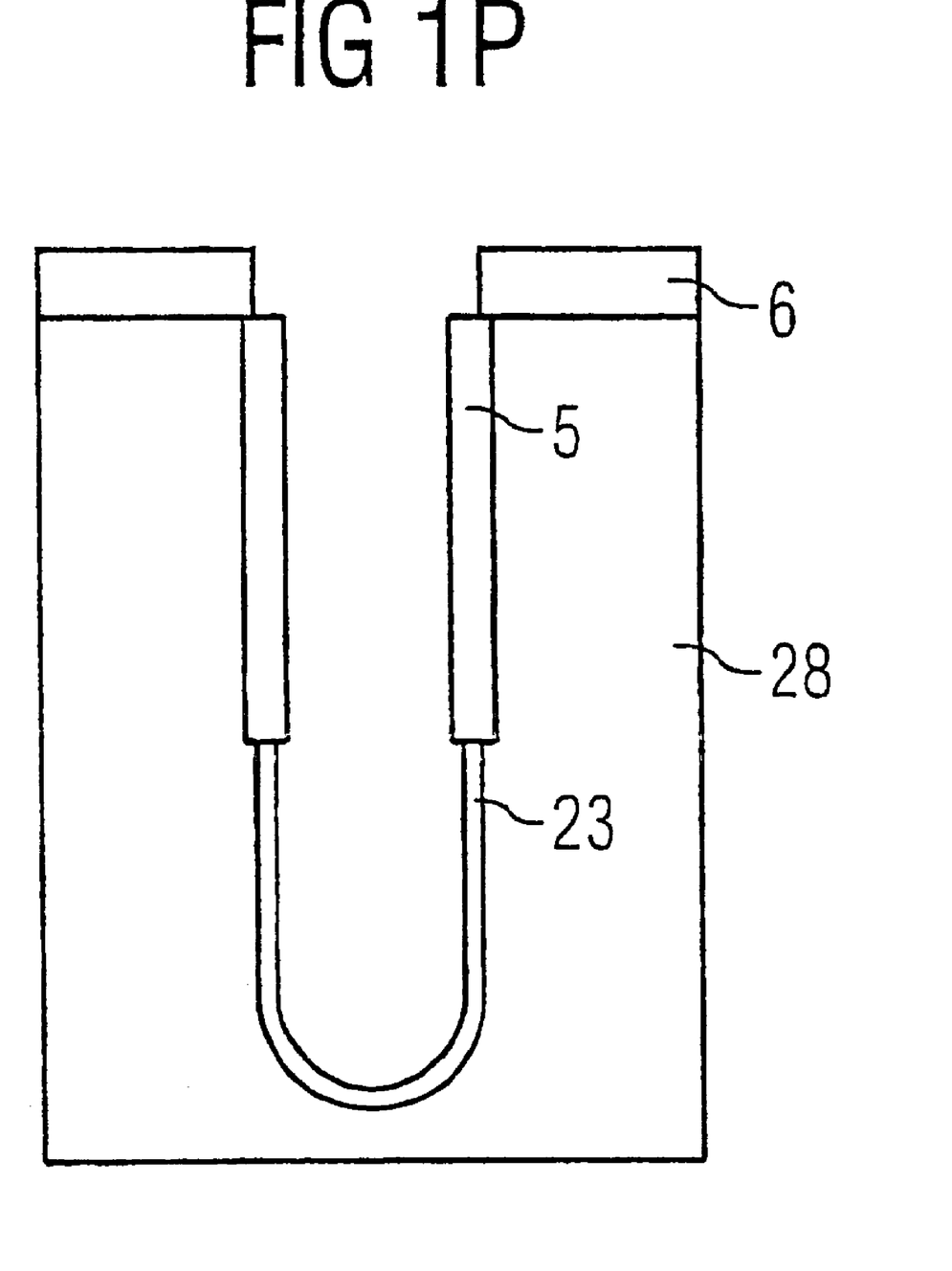

In accordance with FIG. 1L, a covering layer 23 including a nitride, for example, including silicon nitride, is deposited in the trench 15, completely covering the inner wall 4. The structure is covered over the entire surface with a filling material, which is then etched back to a depth that corresponds to a part of the trench depth. As such, the structure illustrated in FIG. 1M is formed, in which a filling 26 covers the covering layer 23 in a lower subregion 22 of the trench. In the upper trench region 24, the covering layer 23 can be etched back again so that here, as illustrated in FIG. 1N, the substrate material 2 is uncovered. The filling 26 typically is of a resist that would be destroyed at higher temperatures that are used during epitaxy and would damage the semiconductor surfaces. Therefore, the filling 26 is removed from the trench 15. It is now possible for the epitaxial deposition of silicon 25 as shown in FIG. 1O and its electrolytic conversion into silicon oxide 5 as shown in FIG. 1P to be carried out. As a result, the collar region including silicon oxide is formed in the upper region of the trench 15. The structure in FIG. 1P corresponds to that shown in FIG. 1J and can be widened in the lower trench region in a similar manner to that shown in FIG. 1K.

Figure 2A:
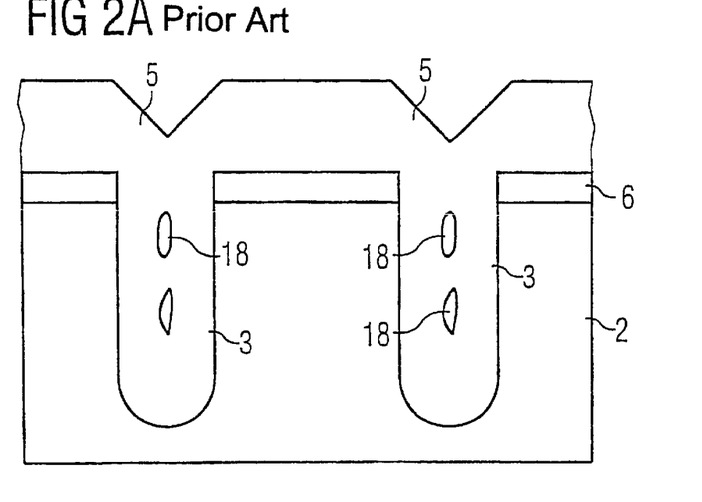
FIGS. 2A to 2B are fragmentary, diagrammatic, cross-sectional views of fabrication of a shallow trench isolation according to the prior art.
Figure 2B:
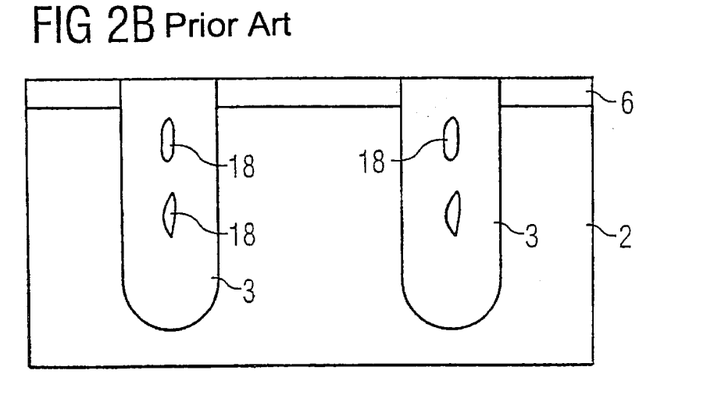

FIGS. 2A and 2B show a conventional deposition process, with the aid of which a recess 3 (trench), corresponding to FIG. 1C, is filled. As shown in FIG. 2A, the material 5 is deposited on the semiconductor substrate 2 provided with the etched trench 3 and accumulates within the trenches 3 and also above the insulating layer 6. A drawback of this is that a very thick layer of the material 5 is formed on the upper side and has to be removed again by chemical mechanical device and/or means. Also, the trenches 3 are not filled completely, but rather their openings become closed up by the deposition process, with the result that cavities 18, referred to as voids, are formed in the interior.

The removal of the layer 5 on the upper side of the substrate down to the insulating layer 6 leads to the semiconductor structure illustrated in FIG. 2B, in which (ideally) the material 5 only fills the trenches 3, but voids 18 remain.

Figure 2C:
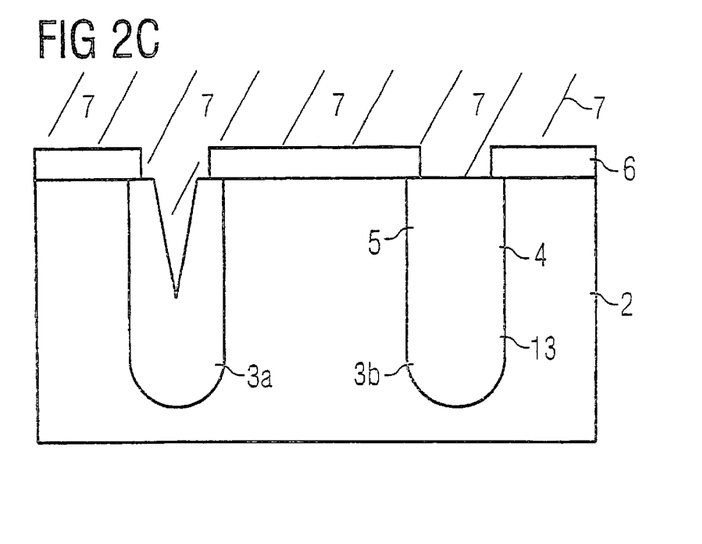
FIGS. 2C to 2E are fragmentary, diagrammatic, cross-sectional views of fabrication of a shallow trench isolation according to the invention.
Figure 2D:
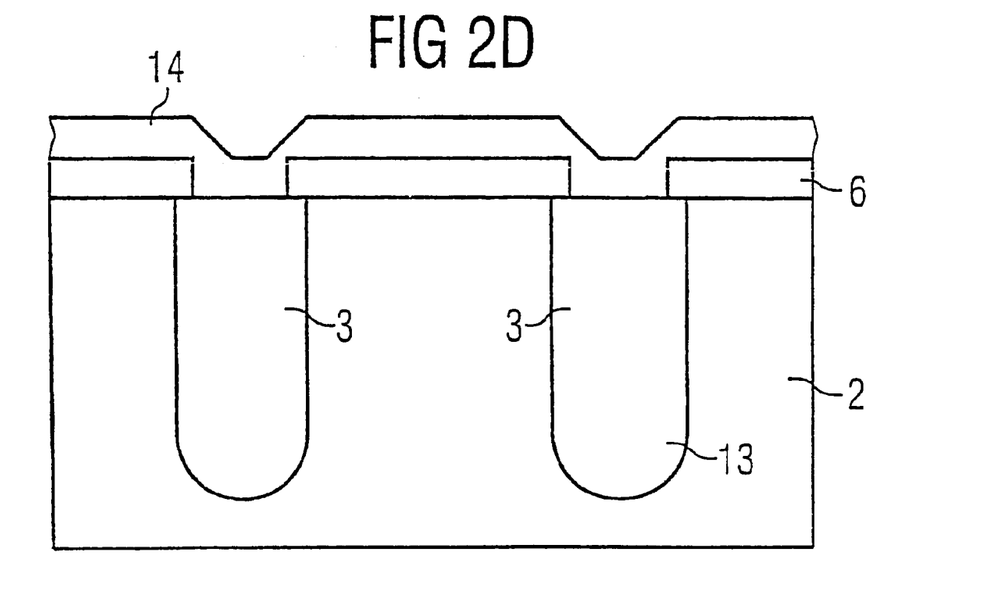

The void-free filling of a trench in accordance with the invention is illustrated in FIGS. 2C and 2D. When the semiconductor substrate 2, which is covered with the insulating layer 6, is brought into contact with the electrolysis liquid 7 and provided with a suitable redox potential, growth at the inner wall 4 completely fills the trenches 3 from the outside inward. The fact that the inner wall 4 narrows slightly in the shape of a cone toward the bottom, with an angle of between 1 and 5° with respect to the surface normal to the substrate surface, and the homogenous growth rate of the electrolytically produced layer 5 in this case result in opposite trench walls initially meeting one another at the bottom, as illustrated with reference to the trench 3a, and continuing to grow together until, as illustrated with reference to the trench 3b, the trench is closed up from the bottom upward. This results in void-free filling. Only the insulating layer 6 extends above the trench filling 5, and, at the height of this layer, as illustrated in FIG. 2D, a thin oxide layer can be deposited also to provide a filling all the way up to the upper side of the layer 6. The thin film 14 illustrated in FIG. 2D can easily be removed by chemical mechanical device and/or means.

Figure 2E:
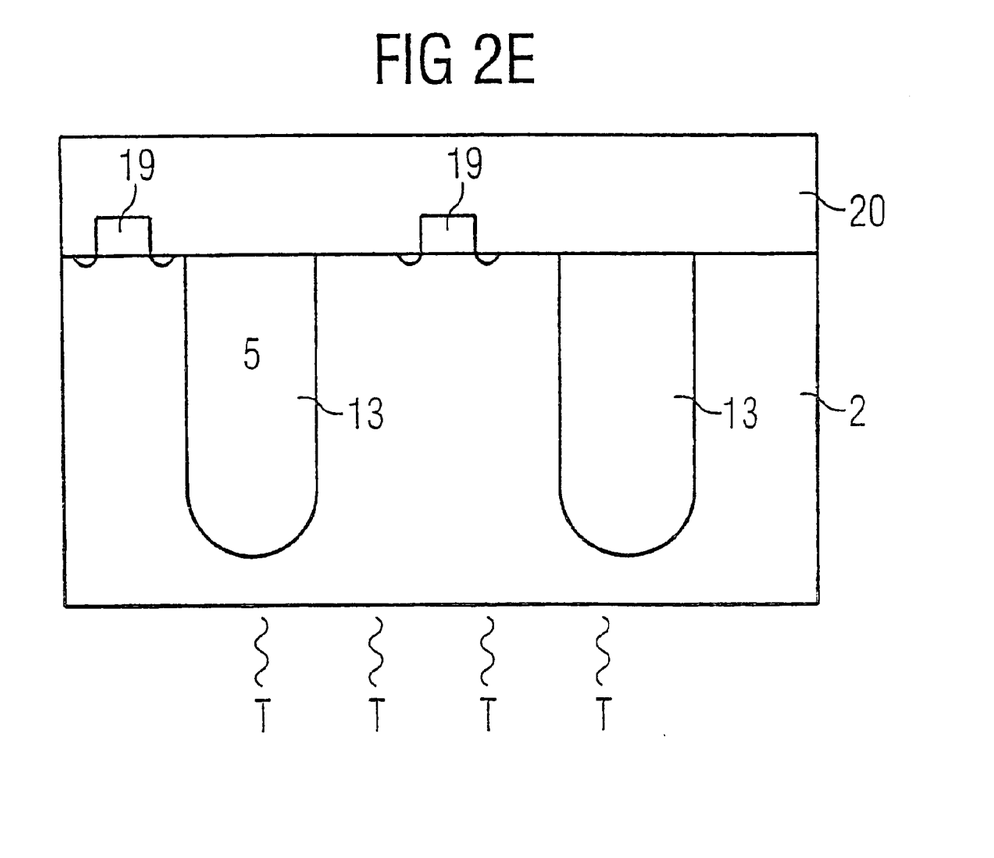

The shallow trench isolations that have been fabricated in accordance with FIGS. 2A to 2D are used to electrically isolate adjacent transistors or other components in an integrated semiconductor circuit from one another. FIG. 2E shows a semiconductor circuit with transistors 19 disposed between shallow trench isolations 13. The transistors are connected to one another above the shallow trench isolations 13 and, thereby, form a semiconductor circuit 20. Before production of the transistors 19, the material 5 that has grown in the trenches 5 is preferably compacted by conditioning at an elevated temperature T of between 300° C. and 700° C., preferably 600° C. A short conditioning time is sufficient for such a purpose if only thin layers of the material 5 are grown.

Figure 3:
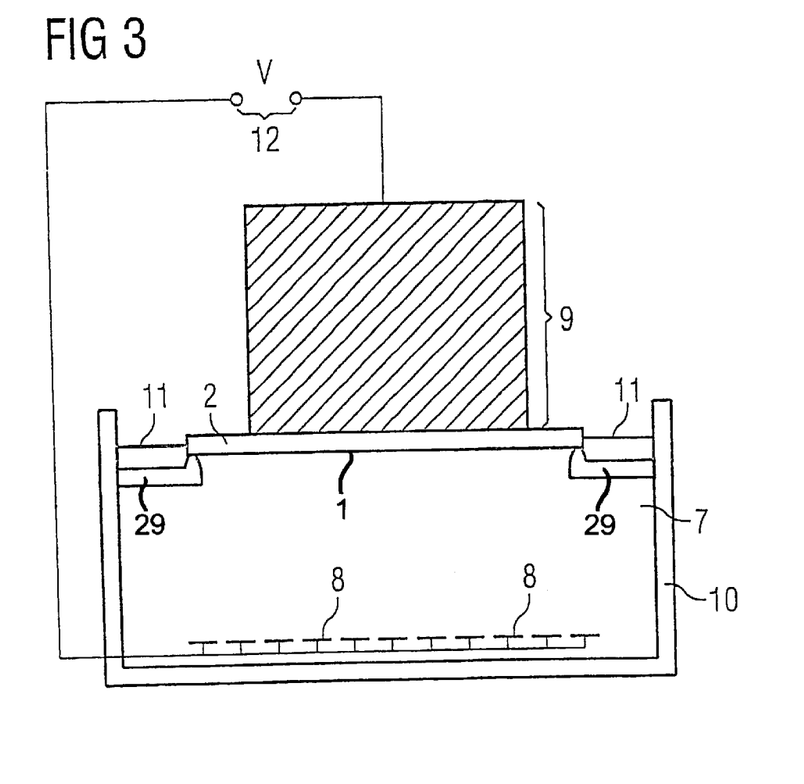
FIG. 3 is a diagrammatic, cross-sectional view of an electrolysis device according to the invention.

FIG. 3 shows an electrolysis vessel 10 that is filled with an electrolysis liquid 7. The semiconductor substrate 2 is disposed at the height of the level 11 of the electrolysis liquid 7, where it is held at the height of the liquid level 11 by holding elements 29 disposed at the edge of the electrolysis vessel 10. As a result, only the downwardly facing front surface 1 of the semiconductor substrate 2 is brought into contact with the electrolysis liquid 7. Recesses, in particular, deep trenches or shallow trenches, have already been produced in the semiconductor substrate 2. Contact between the electrolysis liquid 7 and the recesses can be produced by initially dipping the semiconductor substrate 2 into the liquid at an angle so that air that is present in the recesses can escape. The electrolysis liquid 7 preferably contains chemical substances that effect wetting of the substrate surface 1 by the liquid.

To fill these trenches by electrolysis, i.e., to grow a material on the inner walls of the trenches, the semiconductor substrate is used as one of two electrodes during an electrolysis process.

The first electrode 8 is located at the bottom of the electrolysis vessel 10. The semiconductor substrate 2, or more specifically those regions on the front surface 1 of the substrate 1 that are electrically conductive and are in contact with the electrolysis liquid 7, forms the second electrode 9. These regions are, for example, the inner walls of shallow trenches or of deep trenches, in particular, collar regions.

The semiconductor substrate 2 is electrically connected from its upward facing rear surface and, like the first electrode 8, is connected to the voltage source 12.

Figure 4:
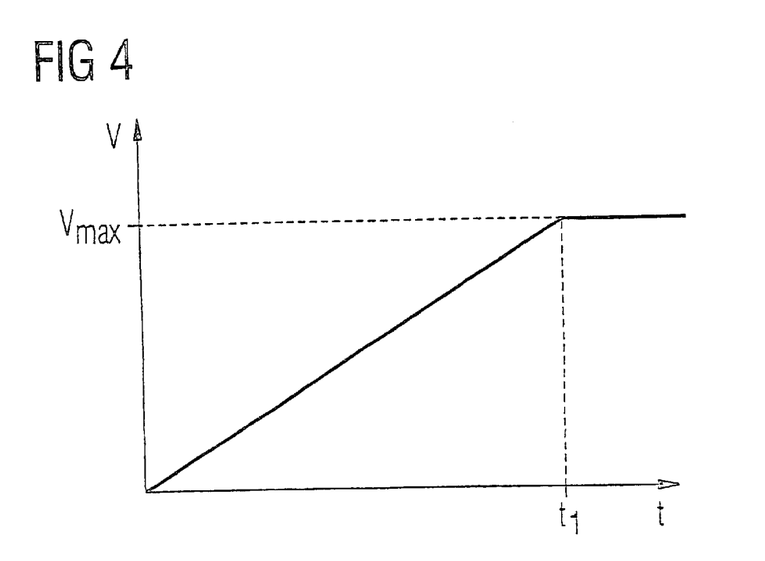
FIG. 4 is a graph illustrating a voltage curve for the electrolysis carried out in accordance with the invention.

FIG. 4 shows a typical profile of the electrolysis voltage, which corresponds to a galvanostatic electrolysis, i.e., an electrolysis that proceeds with a current density that is constant over the course of time. The electrolysis voltage V is continuously increased from 0 to a maximum value $V_{max}$ that corresponds to a predetermined layer thickness of grown layers. Because the grown layer—an insulator—represents an electrical resistance, the level of which increases as the layer thickness grows, an increasingly high electrolysis voltage is required as the duration of the electrolysis progresses. If this is not achieved, further growth will no longer take place. As such, layers of particularly homogeneous thicknesses can be grown in inner walls of trenches.

It is preferable for the maximum electrolysis voltage $V_{max}$ to be retained unchanged for a certain time to ensure that the grown layer can reach the intended layer thickness throughout the inner walls of the trenches.

The electrolysis voltages used are preferably between 2 and 60 volts, a maximum voltage of 60 volts corresponding to a layer thickness of a grown insulator of the order of magnitude of approximately 30 nm. The fact that the maximum voltage or another, lower potential difference has been reached can be used to detect the end point of the electrolysis operation. The electrolysis is preferably carried out for between 10 and 60 minutes.

The electrolyte used is preferably ethylene glycol with potassium nitrate as conductive salt and only a low water content. The use of other aqueous or organic electrolytes is also conceivable. In the case of a silicon substrate, the following anodic oxidation takes place on the inner wall of the trenches of the semiconductor substrate 2, which is being used as the anode:

and, by way of example, the following reduction takes place at the second electrode, which may be formed as a platinum-containing counterelectrode:

The hydrogen formed at the cathode is formed in such small quantities that it can be dissolved by sufficient convection of the electrolysis liquid or can be removed from the electrode in some other way without gas bubbles being formed, such bubbles possibly covering the surface of the semiconductor substrate 2.

With the aid of the method according to the invention, it is possible for inner walls of trenches of very high aspect ratios to be covered with homogeneous layers and for the trenches also to be filled without there being any voids. The electrolytically produced material grows only at the electrically conductive inner wall of the trenches, while growth on the surface of the semiconductor substrate outside the trenches is prevented by an electrically insulating layer. The galvanostatic electrolysis operation allows the production of covering layers of a very homogeneous layer thickness on the trench inner walls. In the case of anodic oxidation, the increase in the layer thickness of the oxide is accelerated compared to a deposition process as a result of the oxide that is formed growing into the semiconductor substrate if, for example, silicon is converted into silicon oxide.

We claim:

1. A method for fabricating an integrated semiconductor circuit, which comprises:

forming at least one recess in a surface of a semiconductor substrate;

epitaxially depositing a reserve material on an inner wall of the recess;

producing an electrically insulating layer on the surface of the substrate outside the recess; and bringing the substrate as an electrode into contact with an electrolysis liquid and carrying out electrolysis to:
selectively grow a material on the inner wall of the recess while the insulating layer prevents the material from growing outside the recess; and
convert the reserve material into the material being grown by the electrolysis.

2. The method according to claim 1, which further comprises carrying out the electrolysis with a galvanostatic electrolysis in which an electrolysis voltage rises over a duration of the galvanostatic electrolysis until the electrolysis voltage reaches a maximum value.

3. The method according to claim 2, which further comprises maintaining the maximum value of the electrolysis voltage until a thickness of the electrolytically grown material corresponding to the maximum value has been substantially reached in all areas in the recess.

4. The method according to claim 3, which further comprises continuing the electrolysis until the growth has closed up the recess and the electrolytically grown material completely fills the recess below the electrically insulating layer.

5. The method according to claim 1, which further comprises continuing the electrolysis until the growth has closed up the recess and the electrolytically grown material completely fills the recess below the electrically insulating layer.

6. The method according to claim 1, which further comprises bringing an upper side of the substrate into contact with a surface level of the electrolysis liquid by holding the substrate with the upper side facing downward.

7. The method according to claim 1, which further comprises carrying out the epitaxial deposition step by selectively epitaxially depositing the reserve material on material of the substrate at the inner wall of the recess.

8. The method according to claim 1, which further comprises continuing the electrolysis until:
the reserve material is completely consumed; and
a quantity of material of the substrate at least half as great as a quantity of reserve material consumed is converted.

9. The method according to claim 7, which further comprises continuing the electrolysis until:
the reserve material is completely consumed; and
a quantity of material of the substrate at least half as great as a quantity of reserve material consumed is converted.

10. The method according to claim 7, which further comprises depositing silicon oxidized during the electrolysis as the reserve material.

11. The method according to claim 9, which further comprises depositing silicon oxidized during the electrolysis as the reserve material.

12. The method according to claim 1, wherein the recess is a trench isolating adjacent components on the surface of the semiconductor substrate from one another, and which further comprises filling the trench with the electrolytically grown material over an entire cross-section of the trench.

13. The method according to claim 12, which further comprises subsequently covering the trench by deposition up to an upper side of the electrically insulating layer.

14. The method according to claim 1, wherein the recess is a trench for a storage capacitor and the trench extends vertically into the semiconductor substrate, and which further comprises covering the inner wall of the trench with the electrolytically grown material.

15. The method according to claim 14, which further comprises:
carrying out the epitaxial deposition step by selectively epitaxially depositing the reserve material on material of the substrate at the inner wall of the recess;
continuing the electrolysis until:
the reserve material is completely consumed; and
a quantity of material of the substrate at least half as great as a quantity of reserve material consumed is converted;
depositing silicon oxidized during the electrolysis as the reserve material; and
producing a collar region with the electrolytically grown material in the trench.

16. The method according to claim 15, which further comprises:
before carrying out the electrolysis:
depositing the reserve material in the trench; and
fabricating a filling only covering the reserve material in a lower subregion of the trench; and
converting the reserve material above the filling as a result of the electrolysis.

17. The method according to claim 15, which further comprises, before carrying out the electrolysis:
producing a covering layer in the trench covering the inner wall of the trench only in a lower subregion of the trench; and
only depositing the reserve material in an uncovered part of the trench.

18. The method according to claim 17, wherein the covering layer includes a nitride, and which further comprises depositing the covering layer.

19. The method according to claim 17, wherein the covering layer includes silicon nitride, and which further comprises depositing the covering layer.

20. The method according to claim 1, which further comprises producing the electrically insulating layer with a nitride.

21. The method according to claim 1, which further comprises producing the electrically insulating layer with silicon nitride.

22. The method according to claim 1, which further comprises growing an oxide by electrolysis.

23. The method according to claim 1, which further comprises growing silicon oxide by electrolysis.

24. The method according to claim 1, which further comprises compacting the electrolytically grown material by conditioning.

25. The method according to claim 1, which further comprises compacting the electrolytically grown material by heating.

26. A method for fabricating an integrated semiconductor circuit, which comprises:
forming at least one recess in a surface of a semiconductor substrate; and
growing a material on an inner wall of the recess by:
producing an electrically insulating layer on the surface of the substrate outside the recess;
bringing the substrate as an electrode into contact with an electrolysis liquid and carrying out electrolysis to selectively grow the material on the inner wall of the recess with the insulating layer preventing the material from growing outside the recess;
before carrying out the electrolysis, epitaxially depositing a reserve material on the inner wall of the recess; and during the electrolysis, converting the reserve material into the material being grown by the electrolysis.

27. A method for homogeneously filling at least one recess in a surface of a semiconductor substrate, the recess having an inner wall, the method which comprises:

epitaxially depositing a reserve material on the inner wall of the recess;

producing an electrically insulating layer on the surface of the substrate outside the recess; and bringing the substrate as an electrode into contact with an electrolysis liquid and carrying out electrolysis to:

selectively grow a material on the inner wall of the recess while the insulating layer prevents the material from growing outside the recess; and convert the reserve material into the material being grown by the electrolysis.

* * * * *